(12) United States Patent
Kim et al.

(10) Patent No.: US 10,734,425 B2
(45) Date of Patent: Aug. 4, 2020

(54) IMAGE SENSOR AND METHOD FOR FABRICATING THE SAME

(71) Applicant: SK hynix Inc., Gyeonggi-do (KR)

(72) Inventors: Do-Hwan Kim, Chungcheongbuk-do (KR); Ji-Suk Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/033,757

(22) Filed: Jul. 12, 2018

(65) Prior Publication Data

US 2019/0148432 A1 May 16, 2019

(30) Foreign Application Priority Data

Nov. 13, 2017 (KR) ........................ 10-2017-0150570

(51) Int. Cl.
*H01L 27/146* (2006.01)
*H04N 5/232* (2006.01)

(52) U.S. Cl.
CPC .... *H01L 27/14623* (2013.01); *H01L 27/1462* (2013.01); *H01L 27/14685* (2013.01); *H04N 5/232122* (2018.08); *H01L 27/14621* (2013.01); *H01L 27/14627* (2013.01); *H01L 27/14645* (2013.01)

(58) Field of Classification Search
CPC ................. H04N 5/232122; H01L 27/14623
See application file for complete search history.

(56) References Cited

U.S. PATENT DOCUMENTS

| | | | |
|---|---|---|---|
| 2011/0228150 A1* | 9/2011 | Takata | H01L 27/307 348/294 |
| 2014/0367686 A1* | 12/2014 | Odnoblyudov | H01L 33/08 257/49 |
| 2015/0279885 A1 | 10/2015 | Tu et al. | |
| 2016/0013231 A1* | 1/2016 | Lee | H01L 27/1463 257/432 |
| 2016/0112614 A1 | 4/2016 | Masuda et al. | |

FOREIGN PATENT DOCUMENTS

KR 101680865 12/2016

OTHER PUBLICATIONS

Hildebrandt, E. et al., Controlled oxygen vacancy induced p-type conductivity in $HfO_{2-x}$ thin films, Nov. 11, 2011, pp. 1-4.
Martinez, F. L. et al., Optical properties and structure of $HfO_2$ thin films grown by high pressure reactive sputtering, Aug. 16, 2007, pp. 5256-5265, Journal of Physics D: Applied Physics, IOP Publishing.

* cited by examiner

*Primary Examiner* — Farun Lu
(74) *Attorney, Agent, or Firm* — IP & T Group LLP

(57) ABSTRACT

An image sensor, comprising: a pixel array in which a plurality of pixels are arranged, wherein at least one of the plurality of pixels includes: a substrate including a photo-electric transformation element having a light receiving region and a light shielding region; and a first hafnium-containing layer formed to contact the substrate corresponding to the light shielding region.

16 Claims, 5 Drawing Sheets

IMAGE SENSOR AND METHOD FOR FABRICATING THE SAME

CROSS-REFERENCE TO RELATED APPLICATION(S)

The present application claims priority to Korean Patent Application No. 10-2017-0150570, filed on Nov. 13, 2017, which is incorporated herein by reference in its entirety.

BACKGROUND

1. Field

Various embodiments of the disclosure generally relate to a semiconductor device fabrication technology and, more particularly, to an image sensor having phase difference detecting pixels suitable for detecting phase differences, and a fabricating method thereof.

2. Description of the Related Art

Most imaging devices, such as digital cameras and camcorders, may have an auto-focus system. The auto-focus system may be achieved by either an active method, measuring a distance to the subject independently of an optical system, or a passive method performing a passive analysis of an image that is entering the optical system. The passive method may include a phase detection scheme dividing an incoming light into pairs of images and comparing their phases and a contrast detection scheme measuring contrast within a sensor field through a lens.

Phase difference auto-focus systems have a sensor for detecting phase differences in addition to an image sensor. Auto-focusing is achieved by adjusting the lens based on an output of the phase difference detecting sensor. The phase difference auto-focus detecting scheme may require a mirror. For example, in an auto-focusing scheme for a Digital Single Lens Reflection (DSLR) camera, a sub-mirror for guiding an incident light into a phase difference detecting sensor is additionally included with a main mirror which guides an incident light for obtaining an image. The phase difference-based auto-focusing is advantageous in that fast-high-performance auto-focusing is possible. However, the phase difference-based auto-focusing is a high-cost system since it requires both an additional sensor and an additional optical system dedicated to phase difference-based auto-focusing.

In comparison, contrast detecting scheme auto-focus systems rely on high-frequency data extracted from the image sensor. This method of auto-focusing is referred to as a contrast auto-focusing. Since contrast auto-focusing does not require a signal processing circuit and an additional sensor, which are required for phase difference-based auto-focusing, the contrast auto-focusing may be implemented for a relatively low cost. However, contrast auto-focusing operates slower and is less accurate than phase difference-based auto-focusing.

SUMMARY

Embodiments of the disclosure are directed to a phase difference detecting pixel and a method of fabricating the same that enhance or improve the light shielding property and the electrical insulating property of the image sensor.

In accordance with an embodiment of the present invention, an image sensor may comprise: a pixel array in which a plurality of pixels are arranged, wherein at least one of the plurality of pixels may include: a substrate including a photoelectric transformation element having a light receiving region and a light shielding region; and a first hafnium-containing layer formed to contact the substrate corresponding to the light shielding region.

The image sensor may further comprise a second hafnium-containing layer formed over the substrate corresponding to the light receiving region. A sidewall of the first hafnium-containing layer and a sidewall of the second hafnium-containing layer are in contact with each other. The first hafnium-containing layer and the second hafnium-containing layer may include hafnium oxide including a hafnium and an oxygen ($O_2$), respectively. The Hafnium (Hf) and the oxygen ($O_2$) contained in the first hafnium-containing layer are stoichiometrically unstable and the Hafnium (Hf) and the oxygen ($O_2$) contained in the second hafnium-containing layer are stoichiometrically stable. The first hafnium-containing layer comprises a hafnium silicide and the second hafnium-containing layer comprises a hafnium silicate. An oxygen-containing rate of the second hafnium-containing layer may be greater than an oxygen-containing rate of the first hafnium-containing layer. The first hafnium-containing layer may be in an electrically floating state.

In accordance with an embodiment of the present invention, an image sensor may comprise: a pixel array in which a plurality of pixels are arranged, wherein at least one of the plurality of pixels may include: a substrate which comprises a photoelectric transformation element having a light receiving region and a light shielding region; a light shielding layer formed to contact the substrate corresponding to the light shielding region and including a metal silicide; and a light transparent layer formed over the substrate corresponding to the light receiving region and including a metal silicate.

The light shielding layer and the light transparent layer may include the same metal. The metal silicide comprises a hafnium silicon (HfSi) and the metal silicate comprises a hafnium silicon oxide (HfSiO). A sidewall of the light shielding layer and a sidewall of the light transparent layer are in contact with each other.

In accordance with an embodiment of the present invention, an image sensor may comprise: a pixel array in which a plurality of pixels are arranged, wherein at least one of the plurality of pixels may include: a substrate which comprises a photoelectric transformation element having a light receiving region and a light shielding region; a light shielding layer formed to contact the substrate corresponding to the light shielding region; and a light transparent layer formed over the substrate corresponding to the light receiving region, the light shielding layer includes a first metal oxide, the light transparent layer includes a second metal oxide having a different oxygen content from the first metal oxide.

The oxygen content of the second metal oxide may be greater than the oxygen content of the first metal oxide. The first metal oxide and the second metal oxide comprise a hafnium (Hf). The hafnium (Hf) and the oxygen ($O_2$) included in the first metal oxide are stoichiometrically unstable, and the hafnium (Hf) and the oxygen ($O_2$) included in the second metal oxide are stoichiometrically stable. The first metal oxide comprises $HfO_x$ (where x may be equal to or less than 1) and the second metal oxide comprise ($HfO_2$). A sidewall of the first metal oxide and a sidewall of the second metal oxide are in contact with each other.

In accordance with an embodiment of the present invention, a method for fabricating an image sensor, may comprise: forming a photoelectric transformation element including a light receiving region and a light shielding region in a substrate; and forming a light shielding layer in contact with the substrate corresponding to the light shielding region and a light transparent layer formed over the substrate corresponding to the light receiving region. The light shielding layer comprises a first hafnium-containing layer, the light transparent layer may comprise a second hafnium-containing layer.

A sidewall of the light shielding layer and a sidewall of the light transparent layer are in contact with each other. The forming of the light shielding layer and the light transparent layer may comprise forming a silicon oxide pattern on the substrate corresponding to the light receiving region; forming a hafnium layer over the substrate corresponding to the light shielding region and over the silicon oxide pattern; and performing a heat treatment to form a hafnium silicate over the substrate corresponding to the light receiving region and forming a hafnium silicide on the substrate corresponding to the light shielding region. The forming of the light shielding layer and the light transparent layer may comprise forming the silicon oxide pattern on the substrate corresponding to the light receiving region; forming a hafnium layer on the substrate corresponding to the light shielding region and on the silicon oxide pattern; and forming a first hafnium oxide layer and a second hafnium oxide layer having a larger oxygen content than the first hafnium oxide layer by inducing a thermodynamic reaction.

These and other features and advantages of the present invention will become apparent to those with ordinary skill in the art to which the present invention belongs from the following description in conjunction with the accompanying drawings.

DETAILED DESCRIPTION

Figure 1:
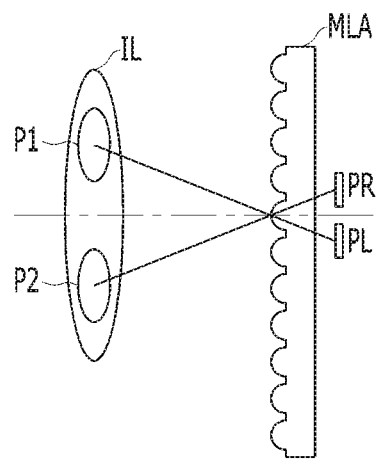
FIG. 1 illustrates detecting of phase differences using a phase-difference detecting system.

Various embodiments of the disclosure are described below in more detail with reference to the accompanying drawings. However, elements and features of the disclosure may be configured or arranged differently than shown in the described and illustrated embodiments, as will be apparent to those skilled in the art in light of this disclosure. Thus, the disclosure is not limited to the embodiments set forth herein. Rather, the described embodiments are provided so that this disclosure is thorough and complete, and fully conveys the invention to those skilled in the art to which this invention pertains. Moreover, reference to "an embodiment" does not necessarily mean only one embodiment, and different references to "an embodiment" are not necessarily to the same embodiment(s). Throughout the disclosure, like reference numerals refer to like parts throughout the various figures and embodiments of the present invention.

It will be understood that, although the terms "first", "second", "third", and so on may be used herein to identify various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate various features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments and is not intended to limit the invention. As used herein, singular forms are intended to include the plural forms and vice versa, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the invention pertains in view of the disclosure. It will be further understood that terms, such as those defined in commonly used dictionaries, should be interpreted as having a meaning that is consistent with their meaning in the context of the disclosure and the relevant art, and will not be interpreted in an idealized or overly formal sense unless expressly so defined herein.

In the following description, numerous specific details are set forth in order to provide a thorough understanding of the present invention. The invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Various embodiments of the invention will be described in detail with reference to the attached drawings.

Before the image sensor in accordance with the embodiments is described, the principle of detecting phase differences in the phase difference detecting pixels is described with reference to FIGS. 1 to 2B.

Figure 2A:
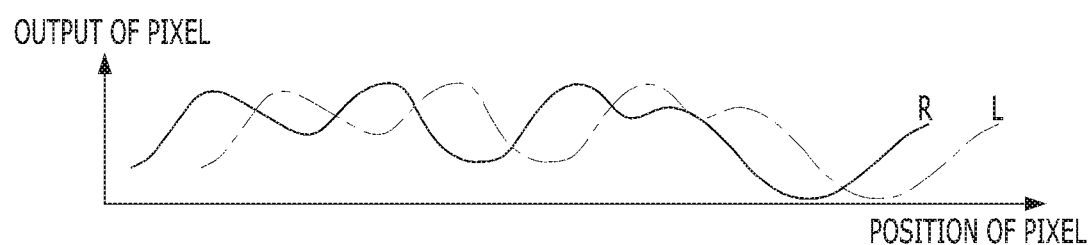
FIGS. 2A and 2B are graphs illustrating the phase difference shown in FIG. 1.

FIG. 1 illustrates detecting of phase differences using a phase-difference detecting system in accordance with an embodiment of the present invention. FIGS. 2A and 2B are graphs for describing the phase difference in accordance with FIG. 1.

Referring to FIG. 1, the phase difference detection auto focusing system includes first and second phase difference detection pixels PR, PL, a micro lens array MLA, and an imaging lens IL.

The first pixel PR and the second pixel PL are required to detect a phase difference by using phase difference detecting pixels. The incident light passing through an imaging lens IL passes through a micro lens array MLA. The incident light is guided into the first pixel PR and the second pixel PL having a photoelectric transformation element.

Among the pupils P1, P2 of the imaging lens IL, the incident light from the pupil P1 disposed over an optical axis of the imaging lens IL is guided into the second pixel PL, whereas the incident light from the pupil P2 disposed under the optical axis of the imaging lens IL is guided into the first pixel PR.

The photoelectric transformation elements in the first pixel PR and the second pixel PL receive an incident light entered through the pupils P1, P2, which is reversely projected through the micro lens array MLA from the pupils P1, P2. This is called "pupil division".

Figure 2B:
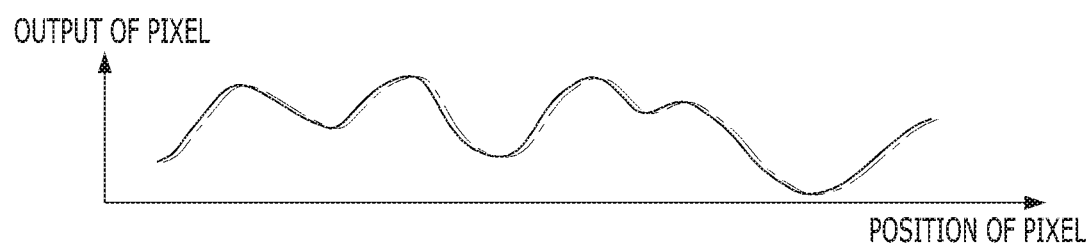

Continuous outputs of the first pixel PR and the second pixel PL, which incorporate pupil division, are shown in FIGS. 2A and 2B.

In the graphs of FIGS. 2A and 2B, the horizontal axis denotes the positions of the first pixel PR and the second pixel PL, while the vertical axis denotes output values of the first pixel PR and the second pixel PL.

Comparing the outputs of the first pixel PR and the second pixel PL, it may be seen that the outputs are the same but shifted, which corresponds to the phase difference.

This is due to the image formation positions of light from the eccentrically formed pupils P1, P2 of the imaging lens IL being different from each other.

As illustrated in FIG. 2A, when focus points of light from the eccentrically formed pupils P1, P2 are inconsistent with each other, the first pixel PR and the second pixel PL exhibit an output phase difference. As illustrated in FIG. 2B, when the focus points of light from the eccentrically formed pupils P1, P2 are consistent with each other, images may be formed at the same position.

Additionally, the direction of focus may be determined from the focus difference. A "front-focusing" indicates that an object is in a front focus state. In front-focusing, the phase of the output of the first pixel PR is shifted further to the left than that in the focused phase, while the phase of the output of the second pixel PL is shifted further to the right than that in the focused phase.

In contrast, "back-focusing" indicates that an object is in a back focus state.

When back-focusing, the phase of the output of the first pixel PR is shifted further to the right than that in the focused phase, while the phase of the output of the second pixel PL is shifted further to the left than in the focused phase. The shift amount between the phases of the first pixel PR and the second pixel PL may be converted to a deviation amount between the points of focus.

The embodiments provide an image sensor that may perform phase difference-based auto-focusing without a phase difference detecting sensor and an optical system. To accomplish this, the embodiments have multiple phase difference detecting pixels capable of detecting phase differences in addition to image pixels that acquire images. In the embodiments, pixels arranged in two dimensions may be divided into image pixels and phase difference detecting pixels. In another example, there may be only phase difference detecting pixels which also function as image sensing pixels.

Figure 3:
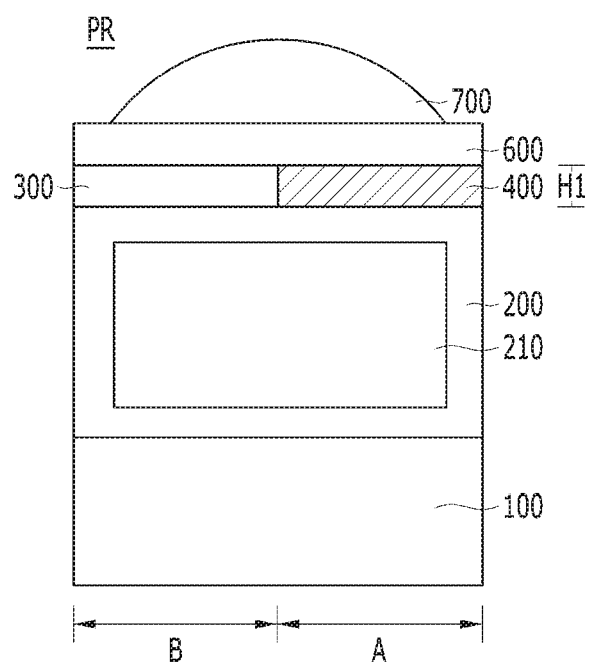
FIG. 3 illustrates a phase-difference detecting pixel in accordance with an embodiment.

FIG. 3 illustrates a phase-difference detecting pixel in accordance with an embodiment. The image sensor includes a pixel array in which a plurality of pixels is arranged in a form of matrix with rows and columns. At least one of the plurality of pixels includes a micro lens 700, a color filter 600, a substrate 200 and an insulation layer 100 sequentially formed from the top.

This structure is applied to both a light shielding region A and a light receiving region B. In the light receiving region B, a light transparent layer 300 may be formed between the color filter 600 and the substrate 200. In the light shielding region A, a light shielding layer 400 may be formed between the color filter 600 and the substrate 200. By way of example but not limitation, FIG. 3 shows the light shielding region A and the light receiving region B included in a single pixel. In another example, a pair of the light shielding region A and the light receiving region B may be arranged in adjacent pixels. Further, the light shielding region A and the light receiving region B may be arranged in at least one row or column in the pixel array. In another example, phase detection pixels including the light shielding region A and the light receiving region B are arranged in a predetermined positional relationship, e.g., diagonal, symmetric or equal-distance location, of the pixel array.

Wires (not shown) including a metallic material are formed in the insulation layer 100. In another embodiment, the wires may not be formed in the insulation layer 100 of the light shielding region A. The insulation layer 100 may include a silicon oxide layer, a silicon nitride layer, a silicon oxide nitride layer, or a combination thereof. In addition to the wires, MOSFETs (metal oxide semiconductor field effect transistors), for example, transfer transistors, reset transistors, source follower transistors, selection transistors and bias transistors, may be formed in the insulation layer 100. The MOSFETs are electrically coupled with each other by the wires.

A support layer (not shown) may be additionally formed under the insulation layer 100. The support layer supports and protects the insulation layer 100. The support layer prevents the wires, formed on or inside the insulation layer 100, from being influenced by external circumstances. The support layer may include a silicon oxide layer, a silicon nitride layer, a silicon oxide nitride layer, or a combination thereof. In another embodiment, the support layer may include single crystalline silicon.

The substrate 200 may include a photoelectric transformation element 210 having the light receiving region B and the light shielding region A. The substrate 200 may comprise a semiconductor substrate. The semiconductor substrate may be in a single crystal state. In another example, the semiconductor substrate may include a silicon-containing material. That is, the substrate 200 may comprise a single crystal silicon-containing material.

The photoelectric transformation element 210 may include a plurality of vertically overlapping photoelectric conversion units. Each of the photoelectric conversion units may be a photo diode including an N-type impurity region and a P-type impurity region. The photoelectric transformation element 210 may include photo transistors, photogates, pinned photodiodes, and the like.

The photoelectric transformation element 210 of the embodiment of the disclosure may include the light receiving region B and the light shielding region A.

The light shielding layer 400 may include a first hafnium-containing layer formed to contact the substrate 200 corresponding to the light shielding region A.

Also, the light shielding layer 400 may shield the incident light entered from the outside through the color filter 600 from being transmitted to the substrate 200. The light shielding layer 400 includes a metal (for example, hafnium (Hf)) but is electrically non-conductive and thus has an electrically floating state.

The light transparent layer 300 formed over the substrate 200 corresponding to the light receiving region B serves as an anti-reflective layer since the light transparent layer 300 transmits the incident light from the color filter 600 to the substrate 200.

The light transparent layer 300 and the light shielding layer 400 may be formed adjacent to each other at the optical axis, e.g., the central axis of the pixel. The light transparent layer 300 and the light shielding layer 400 may occupy a top of the photoelectric transformation element 210 by about 50:50. In addition, the light transparent layer 300 and the light shielding layer 400 may be formed at the same level. Each of one sidewall of the light transparent layer 300 and the light shielding layer 400 may be formed to be in contact with each other.

The light shielding layer 400 in accordance with a first embodiment of the present invention may include a metal silicide and may specifically include hafnium silicon (HfSi). The light transparent layer 300 in accordance with a first embodiment of the disclosure may include a metal silicate. The light transparent layer 300 may specifically include a hafnium silicon oxide (HfSiO). The Hafnium (Hf) and the oxygen (O2) contained in the hafnium silicon oxide (HfSiO) and the hafnium silicon (HfSi) are bonded stoichiometrically. That is, an elemental composition of proportions of the hafnium (Hf) and the oxygen (O2) contained in the hafnium silicon oxide (HfSiO) may be represented by integers.

The light shielding layer 400 in accordance with a second embodiment of the disclosure may include a first metal oxide layer. For example, the first metal oxide layer may specifically include a hafnium oxide (HfOx, where x is equal to or less than 1). The light transparent layer 300 in accordance with a second embodiment of the disclosure may include a second metal oxide layer having a greater oxygen content than the first metal oxide layer. The light transparent layer 300 may specifically include a hafnium oxide (HfO2).

The hafnium (Hf) and oxygen (O2) contained in hafnium oxide (HfOx, where x is equal to or less than 1) are bonded non-stoichiometrically. An elemental composition of proportions of the hafnium (Hf) and oxygen (O2) contained in hafnium oxide (HfOx, where x is equal to or less than 1) may not be represented by integers.

The hafnium (Hf) and oxygen (O2) contained in hafnium oxide (HfO2) are bonded stoichiometrically.

The color filter 600 transmits only visible rays from the light passing through the micro lens 700. The color filter 600 includes one of red filters R which transmit only red rays, green filters G which transmit only green rays, and blue filters B which transmit only blue rays. In another embodiment, the color filter 600 may include cyan filters, yellow filters, and magenta filters.

A micro lens 700 condenses incident light from the outside and transfer the condensed light to the color filter 600.

As described above, since the light transparent layer 300 and the light shielding layer 400 are formed as hafnium oxide layers (with different oxygen ratios), the light transparent layer 300 and the light shielding layer 400 may have the same structure. Even though the light transparent layer 300 and the light shielding layer 400 have the same structure, the light transparent layer 300 has high transmittance characteristics but the light shielding layer 400 has low transmittance characteristics. Therefore, the optical characteristics of the image sensor may be enhanced or improved.

Also, the light transparent layer 300 and the light shielding layer 400 of the disclosure are all formed simultaneously with a hafnium containing layer. Therefore, the fabrication process of the image sensor is simplified and the fabrication cost can be reduced.

The light transparent layer 300 and the light shielding layer 400 are formed to contact the substrate 200, and a distance H1 between the color filter 600 and the substrate 200 is short since the distance H1 depends on a thickness of the light transparent layer 300 and the light shielding layer 400. Therefore, optical sensing sensitivity and crosstalk characteristics can be improved, and the phase difference detection characteristic can be enhanced.

Since the light transparent layer 300 formed at the same level as the light shielding layer 400 serves as the anti-reflective layer, an additional anti-reflective layer having a stacked structure with the light transparent layer 300 is not required.

Since the distance H1 between the color filter 600 and the substrate 200 is as short as the thickness of the light transparent layer 300 and the light shielding layer 400, the optical sensing sensitivity, the crosstalk characteristic and the phase difference detection characteristic can be improved.

A distance H1 between the color filter 600 and the substrate 200 depends on a thickness of the light transparent layer 300 and the light shielding layer 400.

Therefore, the optical sensing sensitivity and crosstalk characteristics of the phase-difference detecting pixel can be improved, and the phase difference detection characteristic can be improved.

FIGS. 4A to 4F are cross-sectional views illustrating a method of fabricating an image sensor in accordance with the embodiment. The insulating layer 100, the color filter 600 and the micro lens 700 of the phase difference detecting pixels shown in FIG. 3 can be formed by a known fabricating method. Therefore, a description thereof will be omitted.

Figure 4A:
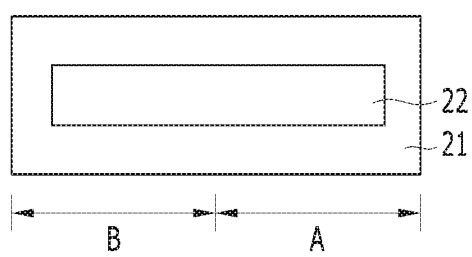
FIGS. 4A to 4F are cross-sectional views illustrating a method of fabricating an image sensor in accordance with the embodiment.

Referring to FIG. 4A, a silicon substrate 21 in which a photoelectric transformation element 22 having the light receiving region B and the light shielding region A is prepared. The silicon substrate 21 is divided into a light receiving region B and a light shielding region A. The silicon substrate 21 corresponds to the substrate 210 shown in FIG. 3. A support layer (not shown) may be formed under the silicon substrate 21. An insulation layer (see 100 of FIG. 3) in which wires (not shown) are formed may be additionally formed between the silicon substrate 21 and the support layer. Alternatively, an insulation layer (see 100 of FIG. 3) in which wires (see of FIG. 3) are formed may be formed over the silicon substrate 21.

Figure 4B:
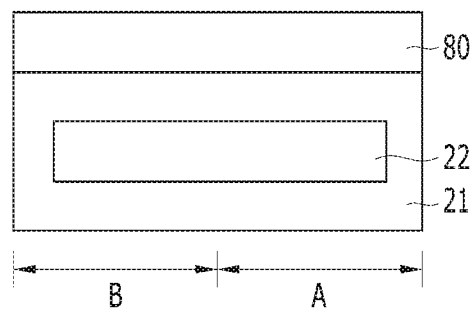

Referring to FIG. 4B, a silicon oxide layer 80 is formed to cover an entire upper surface of the silicon substrate 21, that is, on the light receiving region B and the light shielding region A.

To form the silicon oxide layer 800 on the silicon substrate 21, a chemical vapor deposition, for example, inductively coupled chemical vapor deposition, may be used. In the inductively coupled chemical vapor deposition, vapor decomposition may occur even at low temperatures by generating high-density plasma. Since a region where plasma generates is separated from the silicon substrate 21 by using remote plasma, an ion-damage to a layer-growth region by plasma may be reduced. To deposit the silicon oxide layer 800, a SIH4, an N2O and/or a diluted He gas may be used as reaction gases.

Figure 4C:
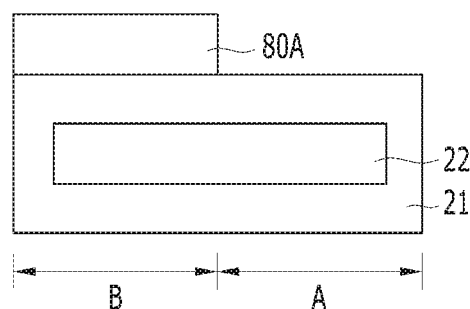

Referring to FIG. 4C, a partial portion of the silicon oxide layer 800 of FIG. 4B which is formed over the light shielding region A is removed. To remove the portion of the silicon oxide layer 800 which is formed over the light shielding region A, first, a photoresist layer (not shown) is formed over the silicon oxide layer 800, and the portion of the photoresist layer which is formed over the light shielding region A is removed by an exposure and development process to form a photoresist pattern on the light receiving region B. Then, the portion of the silicon oxide layer 800 which is formed over the light shielding region A is removed using the photoresist pattern formed over the light receiving region B as a mask. Finally, the photoresist pattern remaining on the light receiving region B is removed to form a silicon oxide pattern 80A.

Figure 4D:
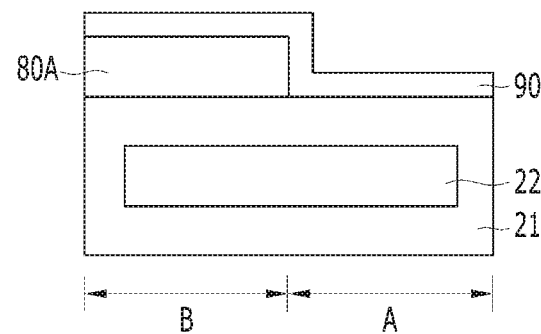

Referring to FIG. 4D, a hafnium layer 90 is formed over the silicon substrate 21 corresponding to the light shielding region A and on the silicon oxide pattern 80A corresponding to the light receiving region B. To form the hafnium layer 90 on the silicon substrate 21, the silicon substrate 21 is placed in a sputtering chamber (not shown). A hafnium material is deposited on the silicon substrate 21 through sputtering.

In detail, while the silicon substrate 21 is placed in a sputtering chamber, the sputtering chamber is kept in a vacuum state, and a sputter gas such as argon (Ar) is introduced into the sputtering chamber. Then, particles of the sputter gas are ionized into a plasma state, and the ionized particles are smashed against a target including hafnium. Hafnium atoms are emitted from the target. The emitted hafnium atoms diffuse into the silicon substrate 21 and are deposited on the silicon substrate 21. As a result, the hafnium layer 90 is formed over the silicon substrate 21. The ionization probability of particles increases due to a magnetic field formed between the N pole and the S pole of a magnet which is positioned on the backside of the target.

Figure 4E:
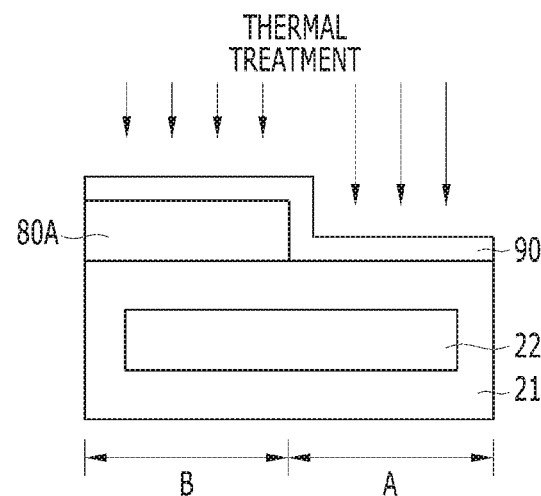
Figure 4F:
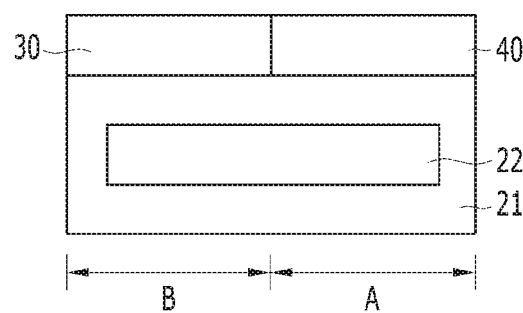

Referring to FIGS. 4E and 4F, a heat treatment is performed over the silicon substrate 21 on which the hafnium layer 90 and the silicon oxide pattern 80A are formed to allow the hafnium layer 90 and the silicon oxide pattern 80A to react with each other.

To form the light transparent layer 30 (300 in FIG. 3) and the light shielding layer 40 (300 in FIG. 3) in accordance with the first embodiment of the disclosure, the silicon substrate 21 on which the hafnium layer 90 and the silicon oxide pattern 80A are formed may be mounted on a thermal chamber and annealing is performed for a predetermined temperature, for example, 300 to 450° C. for 30 up to 150 minutes. Then, the hafnium oxide layers 30, 40 are formed by the above-described thermodynamic reactions.

In the light shielding region A, since the silicon oxide pattern 80A is removed, the silicon (Si) of the silicon substrate 21 and the hafnium (Hf) of the hafnium layer 90 thermodynamically react to each other to form the light shielding layer 40 including a metal silicide.

In the light receiving region B, the light transparent layer 30 including the metal silicate may be formed by thermodynamically reacting SiO2 of the silicon oxide pattern 80A and the hafnium (Hf) of the hafnium layer 90.

Specifically, the light shielding layer 40 may include hafnium silicon (HfSi), and the light transparent layer 30 may include hafnium silicon oxide (HfSiO). The Hafnium silicon oxide (HfSiO) contains oxygen that enhances the transmittance characteristics, which has the transmittance characteristics, but the light shading characteristics are good because hafnium silicon (HfSi) does not contain oxygen.

As a second embodiment for forming the first and the second hafnium oxide layers 30, 40, the silicon substrate 21 including the hafnium layer 90 and the silicon oxide pattern 80A is placed at a room temperature for a predetermined time. Then, the following chemical reactions take place between the hafnium layer 90 and the silicon oxide pattern 80A to form the light transparent layer 30.

The silicon substrate 21, the hafnium layer 90, and the silicon oxide pattern 80A can cause the following chemical reactions.

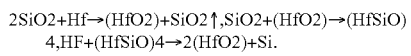

$$2SiO_2 + Hf \rightarrow (HfO_2) + SiO_2 \uparrow, SiO_2 + (HfO_2) \rightarrow (HfSiO)$$
$$4, HF + (HfSiO)_4 \rightarrow 2(HfO_2) + Si.$$

On the light shielding region A, since the silicon oxide layer 80 is removed, the light shielding layer 40 may include the first hafnium-containing layer (HfOx, where x is equal to or less than 1) by reacting the hafnium (Hf) and the oxygen (O2) of the hafnium layer 90 while a thermodynamic reaction takes place between the Si of the silicon substrate 21 and the hafnium (Hf) of the hafnium layer 90 in an oxygen atmosphere.

On the light receiving region B, the light transparent layer 30 may include the hafnium-containing layer (HfO2) formed by reacting the hafnium (Hf) of the hafnium layer 90 and the oxygen (O2) as the SiO2 of the silicon oxide pattern 80A is consumed while a thermodynamic reaction takes place between the SiO2 of the silicon oxide pattern 80A and the hafnium of the hafnium layer 90 in an oxygen atmosphere.

The first hafnium-containing layer (HfOx, where x is equal to or less than 1) includes hafnium (Hf) and oxygen (O2) bonded non-stoichiometrically. The hafnium-containing layer (HfO2) contained in the second hafnium-oxygen is a stoichiometric compound.

The second hafnium-containing layer (HfO2) has higher oxygen content than the first Hafnium-containing layer (HfOx, where x is equal to or less than 1). The first hafnium-containing layer HfOx has a lower oxygen content than the second hafnium-containing layer (HfO2), so the light shading characteristics are better.

After the light transparent layer 30 and the light shielding layer 40 are formed, the silicon material and the hafnium material remaining on the silicon substrate 200 are removed. To remove the silicon material and the hafnium material, a method of immersing the silicon substrate 200 in a silicon etching solution or hafnium etching solution for a predetermined time, a method of cleaning the silicon substrate 200 by using a specified chemical to remove the silicon material and the hafnium material remaining on the silicon substrate 200, and so forth may be used.

As described above, since the light shielding layer (HfSi or HfOx, where x is equal to or less than 1) having a low transmittance characteristic is formed over an upper portion of the light shielding region A, the incident light may not pass through the light shielding layer 40 of the light shielding region A.

Also, although both the light transparent layer 30 and the light shielding layer 40 are include a hafnium containing layer, the light transparent layer 30 has high transmittance characteristics and the light shielding layer 40 can have low transmittance characteristics. Accordingly, the light sensing characteristic of the image sensor can be enhanced.

In addition, since both the light transparent layer 30 and the light shielding layer 40 of the present invention are formed in the same process at the same time with the hafnium containing layer (the oxygen ratios are different from each other), the fabricating process of the image sensor is streamlined, reduced or simplified and the fabricating cost can be reduced.

Also, since the light transparent layer 30 and the light shielding layer 40 of the present invention are formed over the substrate 21 and a distance between the color filter and the substrate (see H1 in FIG. 3) is as short as the thickness of the light transparent layer 30 and the light shielding layer 40, the optical sensing sensitivity and crosstalk characteristics can be improved, and the phase difference detection characteristic can be enhanced.

Since the light transparent layer 30 and the light shielding layer 40 of the present invention are formed over the substrate 21 and the distance between the color filter and the substrate (see H1 in FIG. 3) is the light transparent layer 30 and the light shielding layer 40, the optical sensing sensitivity and crosstalk characteristics can be improved, and the phase difference detection characteristic can be enhanced.

Since the light transparent layer 30 is formed at the same level as the light shielding layer 40, the light transparent layer 30 also acts as an anti-reflection layer. An anti-reflection layer having a stacked structure with the light shielding layer 40 is not additionally required.

As a result, the distance H1 between the color filter and the substrate is as short as the thickness of the light transparent layer 30 and the light shielding layer 40, so that the light sensing sensitivity and crosstalk characteristics can be improved. Additionally, the phase difference detection characteristic can be improved.

Figure 5:
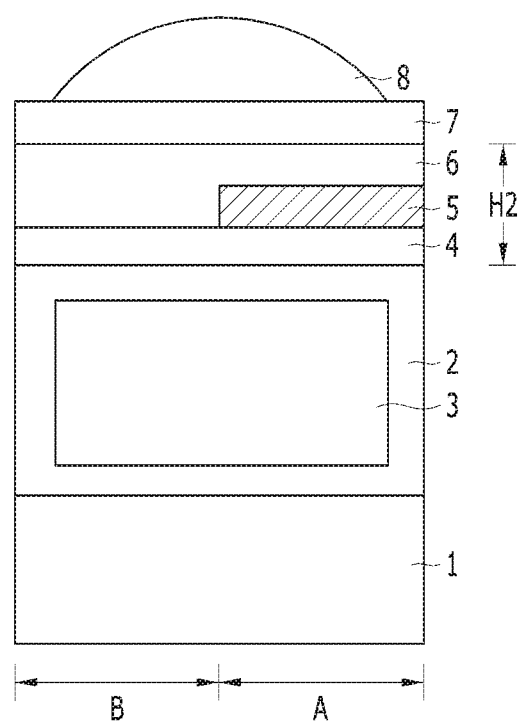
FIG. 5 is a cross-sectional view of a phase-difference detecting pixel in accordance with a comparative example of the phase-difference detecting pixel shown in the FIG. 3.

FIG. 5 is a cross-sectional view of a phase-difference detecting pixel in accordance with a comparative example of the phase-difference detecting pixel shown in the FIG. 3.

Referring to FIG. 5, the phase difference detection pixel in accordance with the comparative example includes a micro lens 8, a color filter 7, a planarization layer 6, a light shielding layer 5, an antireflection layer 4, a substrate 2, and an insulation layer 1 which are sequentially formed from the top.

The micro lens 8 condenses incident light from the outside and may transmit the light to the color filter 7. The micro lens 8 may be formed such that the micro lenses and the ends of adjacent retardation detection pixels are in contact with each other. The micro lens 8 may be formed such that its end portions are spaced apart from each other by a predetermined distance to secure an optical shading characteristic.

The color filter 7 allows only visible light to pass through the micro lens 8. The color filter 7 includes one of a red filter for passing only red light among visible rays, a green filter for passing only green light, and a blue filter for passing only blue light through visible light.

The planarization layer 6 may serve as an antireflection layer for incident light while removing a step due to a predetermined structure (for example, the light shielding layer) formed over the phase difference detection pixel. The planarization layer 6 may be any one single layer selected from the group consisting of an oxide layer, a nitride layer, and an oxide/nitride layer, or a multiple layer in which two or more layers are stacked. The planarization layer 240 guides the incident light through the micro lens 700 to enter the color filter 600 at a predetermined angle. The planarization layer 240 may include an oxide layer, a nitride layer, or a combined layer thereof.

The light shielding layer 5 may shield incident light from the outside through the color filter 7 from being transmitted to the photoelectric transformation element 3 in the substrate 2. The light shielding layer 5 may comprise a metal layer (e.g., tungsten) for shielding the light. The light shielding layer 5 in accordance with the comparative example cannot be formed to contact the substrate 2 because it is formed by extending a grid pattern (not shown). Since the light shielding layer 5 includes a metal layer having conductivity such as tungsten, the light shielding layer 5 cannot be formed to contact the substrate 2.

The antireflection layer 4 prevents incident light through the color filter 7 from being reflected to the outside and transmits the light to the photoelectric transformation element 3 in the substrate 4. For this, the antireflection layer 4 may include a hafnium containing layer (for example, HfO2) for transmitting light.

The incident light from the object is incident on the photoelectric transformation element 3 through the micro lens 8, and the charge generated in the photoelectric transformation element 3 in response to the incident light can be pixel information.

However, in the image sensor having the phase difference detecting pixels, the hafnium-containing layer forming process for forming the antireflection layer 4 and the metal layer forming process for forming the light shielding layer 5 may be separately performed. Although, there is a drawback in that the unit price is increased.

Also, since the light shielding layer 5 is not formed to contact the substrate 2, the optical characteristics of the image sensor deteriorate.

Since the color filter 7 and the substrate 2 are separated from each other by a thickness H2, the light sensing sensitivity and crosstalk characteristics of the photoelectric transformation element 3 included in the substrate 2 may be deteriorated. The thickness H2 is a total thickness of stacked layers including the light shielding layer 5, antireflection coating 4 and planarization layer 6 which is for removing the step of the light shielding layer 5.

However, although the light transparent layer and the light shielding layer of the present invention both include a hafnium containing layer (different oxygen ratios), the light transparent layer has a high transmittance characteristic and the light shielding layer has transmittance characteristics which can be low. Accordingly, the fabricating process of the image sensor can be simplified, and the fabricating cost can be reduced, while the light sensing characteristic of the image sensor is improved.

In addition, the light transmission layer and the light shielding layer of the present invention have the same thickness. Since the light transparent layer formed at the same level as the light shielding layer also acts as an antireflection layer, the light shielding layer and the antireflection layer having a laminated structure are not additionally required.

The distance H1 between the color filter and the substrate is as short as the light transparent layer and the light shielding layer thickness, so that the optical sensing sensitivity, crosstalk and phase difference detection characteristics can be improved.

The disclosure based on the solution of the above-mentioned problems can provide an exemplary image sensor and its manufacturing method for enhancing the light-condensing efficiency and the light-shielding efficiency of the image sensor having the phase difference detection auto focusing system (Auto Focus system).

In addition, the disclosure may suggest an exemplary image sensor and its manufacturing method to simultaneously form the light shielding layer and the light transparent layer in the same process, thereby simplifying the fabricating process and reducing the fabricating cost.

In addition, the disclosure may provide an exemplary image sensor and its manufacturing method for reducing the distance between the color filter and the photoelectric transformation element by forming the light transparent layer and the light shielding layer to contact the substrate rather than the laminate structure. Thus, the light sensing sensitivity, crosstalk characteristics and the phase difference detection characteristic can be improved. Therefore, the defect rate is reduced, and the reliability can be improved.

While the disclosure has been described with respect to specific embodiments, it will be apparent to those skilled in the art in light of this disclosure that various changes and modifications may be made without departing from the spirit and scope of the invention as defined in the following claims.

What is claimed is:

1. An image sensor, comprising:
   a pixel array including a plurality of pixels,
   wherein at least one of the plurality of pixels includes:
   a substrate including a photoelectric transformation element having a light receiving region and a light shielding region;
   a first hafnium-containing layer formed to contact the substrate corresponding to the light shielding region; and
   a second hafnium-containing layer formed over the substrate corresponding to the light receiving region,
   wherein a sidewall of the first hafnium-containing layer and a sidewall of the second hafnium-containing layer are in contact with each other.

2. The image sensor of claim 1, wherein the first hafnium-containing layer and the second hafnium-containing layer include hafnium oxide including a hafnium and an oxygen, respectively,
   wherein a hafnium (Hf) and an oxygen (O2) contained in the first hafnium-containing layer are bonded non-stoichiometrically and the hafnium (Hf) and the oxygen (O2) contained in the second hafnium-containing layer are bonded stoichiometrically.

3. The image sensor of claim 1, wherein an oxygen-containing rate of the second hafnium-containing layer is greater than an oxygen-containing rate of the first hafnium-containing layer.

4. The image sensor of claim 1, wherein the first hafnium-containing layer is in an electrically floating state.

5. The image sensor of claim 1, wherein the first hafnium-containing layer comprises a hafnium silicide and the second hafnium-containing layer comprises a hafnium silicate.

6. An image sensor, comprising:
   a pixel array including a plurality of pixels,
   wherein at least one of the plurality of pixels includes:
   a substrate comprising a photoelectric transformation element having a light receiving region and a light shielding region;
   a light shielding layer formed to contact the substrate corresponding to the light shielding region and including a metal silicide; and
   a light transparent layer formed over the substrate corresponding to the light receiving region and including a metal silicate,
   wherein a sidewall of the light shielding layer and a sidewall of the light transparent layer contact each other.

7. The image sensor of claim 6, wherein the light shielding layer and the light transparent layer include the same metal.

8. The image sensor of claim 6, wherein the metal silicide comprises a hafnium silicon (HfSi) and the metal silicate comprises a hafnium silicon oxide (HfSiO).

9. An image sensor, comprising:
   a pixel array including a plurality of pixels,
   wherein at least one of the plurality of pixels include:
   a substrate comprising a photoelectric transformation element having a light receiving region and a light shielding region;
   a light shielding layer formed to contact the substrate corresponding to the light shielding region; and
   a light transparent layer formed over the substrate corresponding to the light receiving region,
   wherein the light shielding layer includes a first metal oxide,
   wherein the light transparent layer includes a second metal oxide having a different oxygen content from the first metal oxide,
   wherein a sidewall of the first metal oxide and a sidewall of the second metal oxide contact each other.

10. The image sensor of claim 9, wherein the oxygen content of the second metal oxide is greater than the oxygen content of the first metal oxide.

11. The image sensor of claim 9, wherein the first metal oxide and the second metal oxide comprise a hafnium Hf.

12. The image sensor of claim 10, wherein a hafnium and an oxygen included in the first metal oxide are bonded non-stoichiometrically, and the hafnium and oxygen included in the second metal oxide are bonded stoichiometrically.

13. The image sensor of claim 12, wherein the first metal oxide comprises HfOx, where x is equal to or less than 1, and the second metal oxide comprises (HfO2).

14. A method for fabricating an image sensor, comprising:
   forming a photoelectric transformation element including a light receiving region and a light shielding region in a substrate; and
   forming a light shielding layer to contact the substrate corresponding to the light shielding region and a light transparent layer formed over the substrate corresponding to the light receiving region,
   wherein the light shielding layer comprises a first hafnium-containing layer, wherein the light transparent layer comprises a second hafnium-containing layer,
   wherein a sidewall of the light shielding layer and a sidewall of the light transparent layer contact each other.

15. The method of claim 14, wherein the forming the light shielding layer and the light transparent layer comprises: forming a silicon oxide pattern on the substrate corresponding to the light receiving region; forming a hafnium layer over the substrate corresponding to the light shielding region and over the silicon oxide pattern; and performing a heat treatment to form a hafnium silicate over the substrate corresponding to the light receiving region and forming a hafnium silicide on the substrate corresponding to the light shielding region.

16. The method of claim 14, wherein the forming the light shielding layer and the light transparent layer comprises: forming the silicon oxide pattern on the substrate corresponding to the light receiving region; forming a hafnium layer on the substrate corresponding to the light shielding region and on the silicon oxide pattern; and forming a first hafnium oxide layer and a second hafnium oxide layer having a larger oxygen content than the first hafnium oxide layer by inducing a thermodynamic reaction.

* * * * *